(12) United States Patent
Usami

(10) Patent No.: US 6,977,438 B2
(45) Date of Patent: Dec. 20, 2005

(54) DUAL DAMASCENE CIRCUIT WITH UPPER WIRING AND INTERCONNECT LINE POSITIONED IN REGIONS FORMED AS TWO LAYERS INCLUDING ORGANIC POLYMER LAYER AND LOW-PERMITTIVITY LAYER

(75) Inventor: Tatsuya Usami, Tokyo (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/177,667

(22) Filed: Jun. 24, 2002

(65) Prior Publication Data

US 2002/0195711 A1    Dec. 26, 2002

(30) Foreign Application Priority Data

Jun. 25, 2001 (JP) ............................ 2001-191134

(51) Int. Cl.⁷ ............................................. H01L 23/48
(52) U.S. Cl. .................. 257/760; 257/759; 257/750
(58) Field of Search ................... 257/759, 760, 257/750, 758, 771; 438/623, 624

(56) References Cited

U.S. PATENT DOCUMENTS

| | | | |
|---|---|---|---|
| 6,191,031 B1 | 2/2001 | Taguchi et al. | |
| 6,197,696 B1 | 3/2001 | Aoi | |
| 6,222,269 B1 * | 4/2001 | Usami | 257/758 |
| 6,242,339 B1 | 6/2001 | Aoi | |
| 6,294,833 B1 * | 9/2001 | Usami | 257/758 |
| 6,407,011 B1 * | 6/2002 | Ikeda et al. | 438/786 |
| 6,483,193 B2 * | 11/2002 | Usami | 257/758 |
| 6,603,204 B2 * | 8/2003 | Gates et al. | 257/760 |
| 2001/0048165 A1 * | 12/2001 | Usami | 257/771 |
| 2002/0020917 A1 * | 2/2002 | Hirota et al. | 257/758 |
| 2002/0081834 A1 * | 6/2002 | Daniels et al. | 438/624 |
| 2002/0100984 A1 * | 8/2002 | Oshima et al. | 257/774 |
| 2002/0195711 A1 * | 12/2002 | Usami | 257/752 |
| 2003/0049927 A1 * | 3/2003 | Tonegawa et al. | 438/622 |
| 2003/0134500 A1 * | 7/2003 | Komiya et al. | 438/623 |

FOREIGN PATENT DOCUMENTS

| | | |
|---|---|---|
| JP | 10-112503 | 4/1998 |
| JP | 11-243147 | 9/1999 |
| JP | 2000-68376 | 3/2000 |
| JP | 2000-91422 | 3/2000 |
| JP | 2000-294644 | 10/2000 |

OTHER PUBLICATIONS

Merriam-Webster's Collegiate Dictionary, 10th ed., 1998, p. 14.*
English Abstract of JP 2000-294644.
English Abstract of JP 11-243147.
English Abstract of JP 2000-91422.
English Abstract of JP 2000-68376.

* cited by examiner

Primary Examiner—Laura M. Schillinger
(74) Attorney, Agent, or Firm—Foley & Lardner LLP

(57) ABSTRACT

A dual damascene circuit has lower wiring and upper wiring positioned in regions formed as two layers including a CH-based organic polymer layer and a low-permittivity layer made of porous MSQ or the like. The organic polymer layer and the low-permittivity layer have high etching selectively with respect to each other to form an upper groove and a via hole to a good shape, allowing upper wiring and the interconnect line to have good electric characteristics. The organic polymer layer and the low-permittivity layer are low in density and permittivity, thus reducing the effective permittivity of the dual damascene circuit in its entirety.

13 Claims, 5 Drawing Sheets

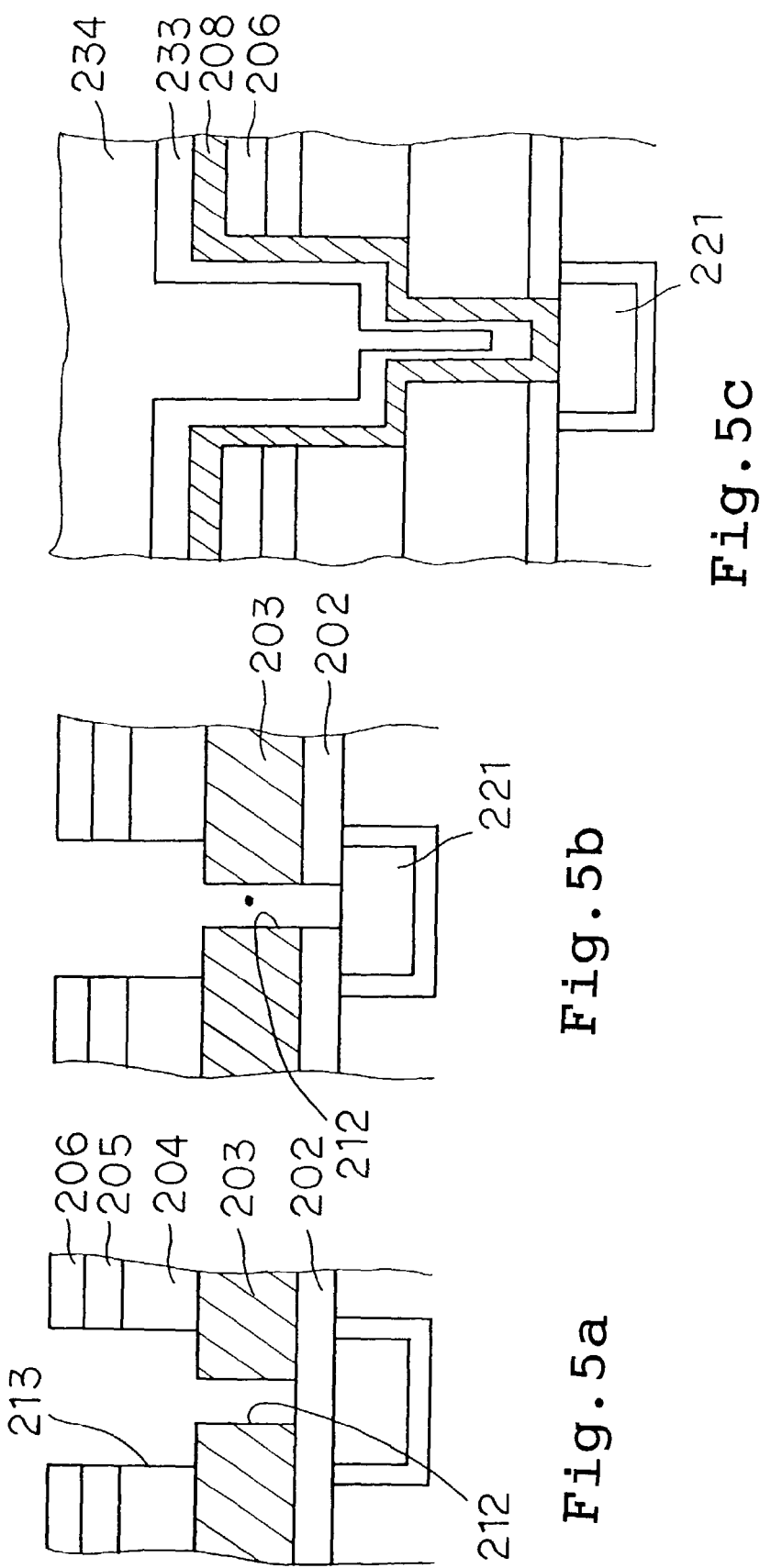

DUAL DAMASCENE CIRCUIT WITH UPPER WIRING AND INTERCONNECT LINE POSITIONED IN REGIONS FORMED AS TWO LAYERS INCLUDING ORGANIC POLYMER LAYER AND LOW-PERMITTIVITY LAYER

BACKGROUND OF THE INVENTION

1. Field of the Invention

The present invention relates to an integrated circuit device having lower wiring and upper wiring connected to each other by an interconnect line, and more particularly to an integrated circuit device fabricated according to the dual damascene process.

2. Description of the Related Art

To meet present demands for integrated circuits of higher performance and smaller patterns, there have been studied various processes for fabricating such integrated circuits and materials to be used in such integrated circuits. For example, while polysilicon or aluminum has heretofore been widely used as the wiring material in integrated circuits, a material having a lower resistance is required to achieve higher performance and smaller patterns for integrated circuits.

It has been proposed to make fine wiring in integrated circuits of copper. However, the properties of copper make it difficult to pattern itself by way of etching, and the corrosion resistance of copper is poor. In view of these difficulties of copper, it is preferable to employ the dual damascene process to fabricate an integrated circuit which has horizontal lower and upper wiring made of a metal such as copper and connected to each other with a vertical interconnect line.

In the integrated circuit thus fabricated by the dual damascene process, i.e., a dual damascene circuit, since the horizontal lower and upper wiring are connected to each other by the vertical interconnect line, it is necessary to form an upper interlayer film on the upper surface of a lower interlayer film in which lower wiring is embedded, form an upper groove and a via hole in the upper interlayer film, and embed upper wiring and the interconnect line in the upper groove and the via hole.

There is a fabrication process in which an upper interlayer film is made as a single layer of an organic polymer or MSK (Methyl Silsesquioxane), a via hole is formed in the upper interlayer film by first photo etching from its upper surface to a certain depth, and an upper groove is formed in the upper interlayer film and the via hole is simultaneously extended to the lower surface by second photo etching.

There is another fabrication process in which an upper interlayer film is comprised of a first layer, a barrier insulating film, and a second layer, a via hole is formed in the second layer and the barrier insulating film by first photo etching, and an upper groove is formed in the second layer and a via hole is simultaneously formed in the first layer from the opening in the barrier insulating film by second photo etching.

According to the first fabrication process described above, since the upper interlayer film is formed as a single layer, a resultant dual damascene circuit is simple in structure, the number of steps of the fabrication process is relatively small, and the effective permittivity of the dual damascene circuit can be reduced because the upper interlayer film may be formed of a low-density material. However, as the upper groove and the via hole are simultaneously formed in the single-layer upper interlayer film, it is difficult to form the upper groove and the via hole to a good shape, and it is particularly difficult to form the upper groove to a desired depth due to mircoloading.

According to the first fabrication process described above, since the upper interlayer film is formed as a single layer, a resultant dual damascene circuit is simple in structure, the number of steps of the fabrication process is relatively small, and the effective permittivity of the dual damascene circuit can be reduced because the upper interlayer film may be formed of a low-density material. However, as the upper groove and the via hole are simultaneously formed in the single-layer upper interlayer film, it is difficult to form the upper groove and the via hole to a good shape, and it is particularly difficult to form the upper groove to a desired depth due to microloading.

Furthermore, since the high-density material which the barrier insulating film is made of is generally of high permittivity, the effective permittivity of the dual damascene circuit is increased. According to the second fabrication process, the via hole tends to have a bowing profile due to excessive etching because the upper groove and the via hole are simultaneously formed.

An integrated circuit and a process of manufacturing same, which solve the above problems, are disclosed in Japanese laid-open patent publication No. 10112503.

As shown in FIG. 1 of the accompanying drawings, dual damascene circuit 100 as the disclosed integrated circuit has lower interlayer film 101 on which there are successively deposited insulating layer 102, low-permittivity layer 103, and mask layer 104. Insulating layer 102 and mask layer 104 are made of silicon oxide such as $SiO_2$, $SiO_x$, SiOF, or the like, and low-permittivity layer 103 is made of an organic material such as polytetrafluoroethylene, polyanile ether fluoride, polyimide fluoride, etc.

Lower groove 111 is formed in lower interlayer film 101 from its upper surface to a certain depth, and lower wiring 105 is embedded in lower groove 111. Via hole 112 is formed in insulating layer 102 all the way from the upper surface to the lower surface thereof. Interconnect line 106 is embedded in via hole 112.

Upper groove 113 is formed in low-permittivity layer 103 all the way from the upper surface to the lower surface thereof, and upper wiring 107 is embedded in upper groove 113. Lower wiring 105, interconnect line 106, and upper wiring 107 are made of aluminum alloy, and lower wiring 105 and upper wiring 107 are connected to each other by interconnect line 106.

A process of fabricating dual damascene circuit 100 having the above structure will briefly be described below.

First, lower wiring 105 is embedded in lower groove 111 which is formed in lower interlayer film 101 from its upper surface to a certain depth. Insulating layer 102, low-permittivity layer 103, and mask layer 104, which are made of silicon oxide, are successively grown on the upper surface of lower interlayer film 101 with lower wiring 105 embedded therein.

Then, a resist mask (not shown) having an opening shaped like upper groove 113 is formed on the upper surface of mask layer 104. An opening corresponding to upper groove 113 is formed in mask layer 104 through the resist mask by plasma etching, after which the resist mask is removed.

A resist mask (not shown) having an opening shaped like via hole 112 is formed on the upper surface of mask layer 104 and the upper surface of an exposed portion of low-permittivity layer 103. Via hole 112 is formed in low-permittivity layer 103 and insulating layer 102 through the resist mask by plasma etching, after which the resist mask is removed.

Upper groove 113 is formed in low-permittivity layer 103 through mask layer 104 by plasma etching. Upper groove 113 and via hole 112 are filled with aluminum alloy, and the upper surface of the assembly is polished by CMP (Chemical Mechanical Polishing), thus completing dual damascene circuit 100 which includes lower wiring 105, interconnect line 106, and upper wiring 107 made of Cu and connected together.

With dual damascene circuit 100, since low-permittivity layer 103 and insulating layer 102 have high etching selectivity with respect to each other, it is possible to form upper groove 113 and via hole 112 to a desired shape to allow interconnect line 106 and upper wiring 107 to have good electric characteristics. However, it is difficult to lower the effective permittivity of entire dual damascene circuit 100 because the insulating layer 102 is made of silicon oxide having a high permittivity ranging from 4.2 to 4.3.

Though not disclosed in Japanese laid-open patent publication No. 10-112503, since interconnect line 106 serves to connect upper wiring 107 to lower wiring 105, lower wiring 105 is laid in a position where interconnect line 106 is formed. If, however, plasma etching for forming via hole 112 reaches lower wiring 105, then lower wiring 105 is corroded and has its electric characteristics lowered.

To eliminate the above drawback, it has been known to protect lower wiring 105 from plasma etching for forming via hole 112 with a barrier insulating film (not shown) layered over the upper surface of lower wiring 105. Such a barrier insulating film is generally formed of silicon nitride.

In dual damascene circuit 100, inasmuch as insulating layer 102 is made of silicon oxide, it has low etching selectivity with respect to the barrier insulating film of silicon nitride. Therefore, when insulating layer 102 is subjected to plasma etching, it is highly likely for the barrier insulating film to be etched away, failing to protect lower wiring 105 effectively.

SUMMARY OF THE INVENTION

It is an object of the present invention to provide an integrated circuit device having upper wiring and an interconnect line formed to a good shape for good electric characteristics and well reduced effective permittivity, and a method of fabricating such an integrated circuit device.

An integrated circuit device according to the present invention has lower wiring, upper wiring, an interconnect line, a lower interlayer film, a barrier insulating film, an organic polymer layer, and a low-permittivity layer. A lower groove is formed in the lower interlayer film from its upper surface to a certain depth, and lower wiring is embedded in the lower groove. The barrier insulating film is layered over the upper surface of the lower interlayer film with lower wiring embedded therein.

In a first integrated circuit device according to the present invention, a CH-based organic polymer layer is layered over the upper surface of the barrier insulating film, and the low-permittivity layer is layered over the organic polymer layer. The low-permittivity layer is made of one of MSQ, HSQ (Hydrogen Silsesquioxane), MHSQ (Methyl Hydrogen Silsesquioxane), and a carbon-containing silicon oxide film. Upper wiring is embedded in an upper groove which is formed in the low-permittivity layer from its upper surface to the upper surface of the organic polymer layer. A via hole is formed in the organic polymer layer and the barrier insulating film and extends from the bottom of the upper groove to the upper surface of lower wiring. The interconnect line is embedded in the via hole and connects lower wiring and upper wiring to each other.

In a second integrated circuit device according to the present invention, the low-permittivity layer is layered over the upper surface of the barrier insulating film, and the organic polymer layer is layered over the low-permittivity layer. Upper wiring is embedded in an upper groove which is formed in the organic polymer layer from its upper surface to the upper surface of the low-permittivity layer. A via hole is formed in the low-permittivity layer and the barrier insulating film and extends from the bottom of the upper groove to the upper surface of lower wiring, with the interconnect line embedded in the via hole.

With the first and second integrated circuit devices, upper wiring is positioned on one of the organic polymer layer and the low-permittivity layer, and the interconnect line on the other. The organic polymer layer and the low-permittivity layer have high etching selectively with respect to each other to form the upper groove and the via hole to a good shape, allowing upper wiring and the interconnect line to have good electric characteristics. The organic polymer layer and the low-permittivity layer are low in density and permittivity, thus reducing the effective permittivity of the integrated circuit device in its entirety.

In the above integrated circuit device, the organic polymer layer is made of one of polyphenylene, polyarylene, polyarylene ether, and benzocyclobutene. As the organic polymer layer is made of a material having high etching selectivity with respect to the low-permittivity layer and also having low permittivity, upper wiring and the interconnect line are formed to a good shape and have good electric characteristics, and the effective permittivity of the integrated circuit device in its entirety is reduced.

At least one of the low-permittivity layer and the organic polymer layer is of a porous structure. Thus, since the permittivity of at least one of the low-permittivity layer and the organic polymer layer is reduced, the effective permittivity of the integrated circuit device in its entirety is further reduced.

Lower wiring, upper wiring, and the interconnect line are made of Cu. Lower wiring, upper wiring, and the interconnect line are formed to a desired pattern of Cu which is difficult to pattern due to its properties, and Cu which is low in corrosion resistance is not corroded in the manufacturing process. Therefore, lower wiring, upper wiring, and the interconnect line have good electric characteristics.

Sine the upper surface of the low-permittivity layer made of a carbon-containing silicon oxide film is planarized by CMP, even if the upper surfaces of the lower interlayer film and lower wiring are not planarized by CMP, the upper surfaces of the low-permittivity layer and the organic polymer layer deposited on the above upper surfaces are planar. Therefore, when a metal layer is deposited on the upper surface of the organic polymer layer with the groove formed therein and then polished by CMP to produce upper wiring, no unwanted metal layer remains un-removed on the organic polymer layer, and failures due to any remaining metal layer are prevented from occurring.

According to a method of manufacturing the first integrated circuit device, lower wiring is embedded in the lower groove formed in the lower interlayer film from the upper surface thereof to the prescribed depth, and the barrier insulating film is layered over the upper surface of the lower interlayer film with lower wiring embedded therein. The CH-based organic polymer layer is layered over the upper surface of the barrier insulating film, the low-permittivity layer made of one of MSQ, HSQ, MHSQ, and a carbon-containing silicon oxide film is layered over the upper surface of the organic polymer layer, and an opening is formed in the low-permittivity layer from the upper surface thereof to the upper surface of the organic polymer layer. The via hole is formed in the organic polymer layer from the bottom of the opening to the upper surface of the barrier insulating film, and the upper groove is formed in the low-permittivity layer from the upper surface thereof to the upper surface of the organic polymer layer in alignment with the via hole. The via hole which is open at the bottom of the upper groove is extended to the upper surface of lower wiring by removing an exposed portion of the barrier insulating film, and bodies of metal integrally is embedded in the via hole and the upper groove thereby forming the interconnect line and upper wiring.

With the above method of manufacturing the first integrated circuit device, the low-permittivity layer and the organic polymer layer have high etching selectivity with respect to each other, allowing the upper groove and the via hole to be formed to a good shape. The barrier insulating film has high etching selectivity with respect to the low-permittivity layer and the organic polymer layer, so that lower wiring is prevented from being corroded when the via hole and the upper groove are formed. The low-permittivity layer and the organic polymer layer have low permittivity, making it possible to manufacture an integrated circuit device with a reduced effective permittivity.

According to a method of manufacturing the second integrated circuit device, the low-permittivity layer and the organic polymer layer are successively layered over the upper surface of the barrier insulating film, and an opening is formed in the organic polymer layer from the upper surface thereof to the upper surface of the low-permittivity layer. The via hole is formed in the low-permittivity polymer layer from the bottom of the opening to the upper surface of the barrier insulating film, and the upper groove is formed in the organic polymer layer from the upper surface thereof to the upper surface of the low-permittivity layer in alignment with the via hole. The via hole which is open at the bottom of the upper groove is extended to the upper surface of lower wiring by removing an exposed portion of the barrier insulating film, and bodies of metal integrally is embedded in the via hole and the upper groove thereby forming the interconnect line and upper wiring.

With the above method of manufacturing the second integrated circuit device, the organic polymer layer and the low-permittivity layer have high etching selectivity with respect to each other, allowing the upper groove and the via hole to be formed to a good shape. The barrier insulating film has high etching selectivity with respect to the low-permittivity layer and the organic polymer layer, so that lower wiring is prevented from being corroded when the via hole and the upper groove are formed. The organic polymer layer and the low-permittivity layer have low permittivity, making it possible to manufacture an integrated circuit device with a reduced effective permittivity.

According to a method of manufacturing the third integrated circuit device, the low-permittivity layer comprising a carbon-containing silicon oxide film is deposited on the upper surface of barrier insulating film, and the upper surface of the low-permittivity layer is planarized by CMP, after which the organic polymer layer is deposited on the planarized upper surface of the low-permittivity layer.

With the above method of manufacturing the third integrated circuit device, even if the upper surfaces of the lower interlayer film and lower wiring are not planarized by CMP, the upper surfaces of the low-permittivity layer and the organic polymer layer deposited on the above upper surfaces are planar. Therefore, when a metal layer is deposited on the upper surface of the organic polymer layer with the groove formed therein and then polished by CMP to produce upper wiring, no unwanted metal layer remains unremoved on the organic polymer layer, and failures due to any remaining metal layer are prevented from occurring.

The above and other objects, features, and advantages of the present invention will become apparent from the following description with reference to the accompanying drawings which illustrate examples of the present invention.

BRIEF DESCRIPTION OF THE DRAWINGS

FIGS. 5a through 5c are vertical cross-sectional views showing successive steps of the method of manufacturing the integrated circuit device shown in FIG. 2.

DETAILED DESCRIPTION OF THE PREFERRED EMBODIMENTS

An embodiment of the present invention will be described below with reference to FIG. 2 through FIG. 5c.

Figure 1:
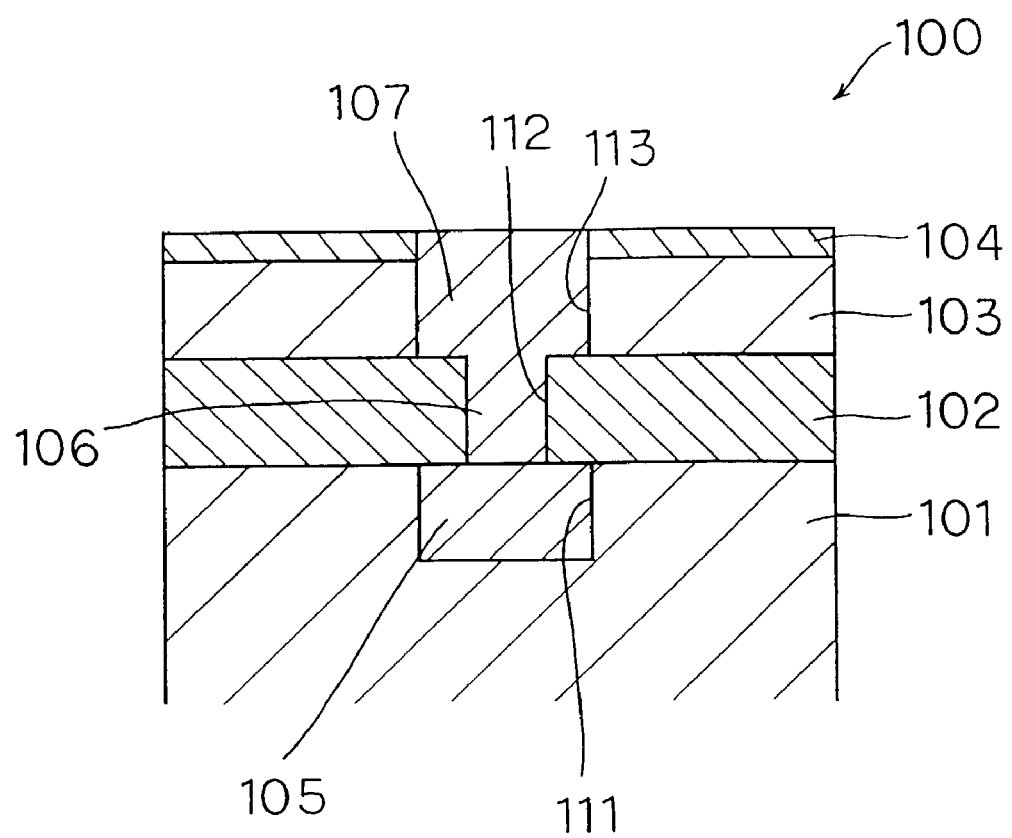
FIG. 1 is a vertical cross-sectional view showing an internal structure of a dual damascene circuit as a conventional integrated circuit device.
Figure 2:
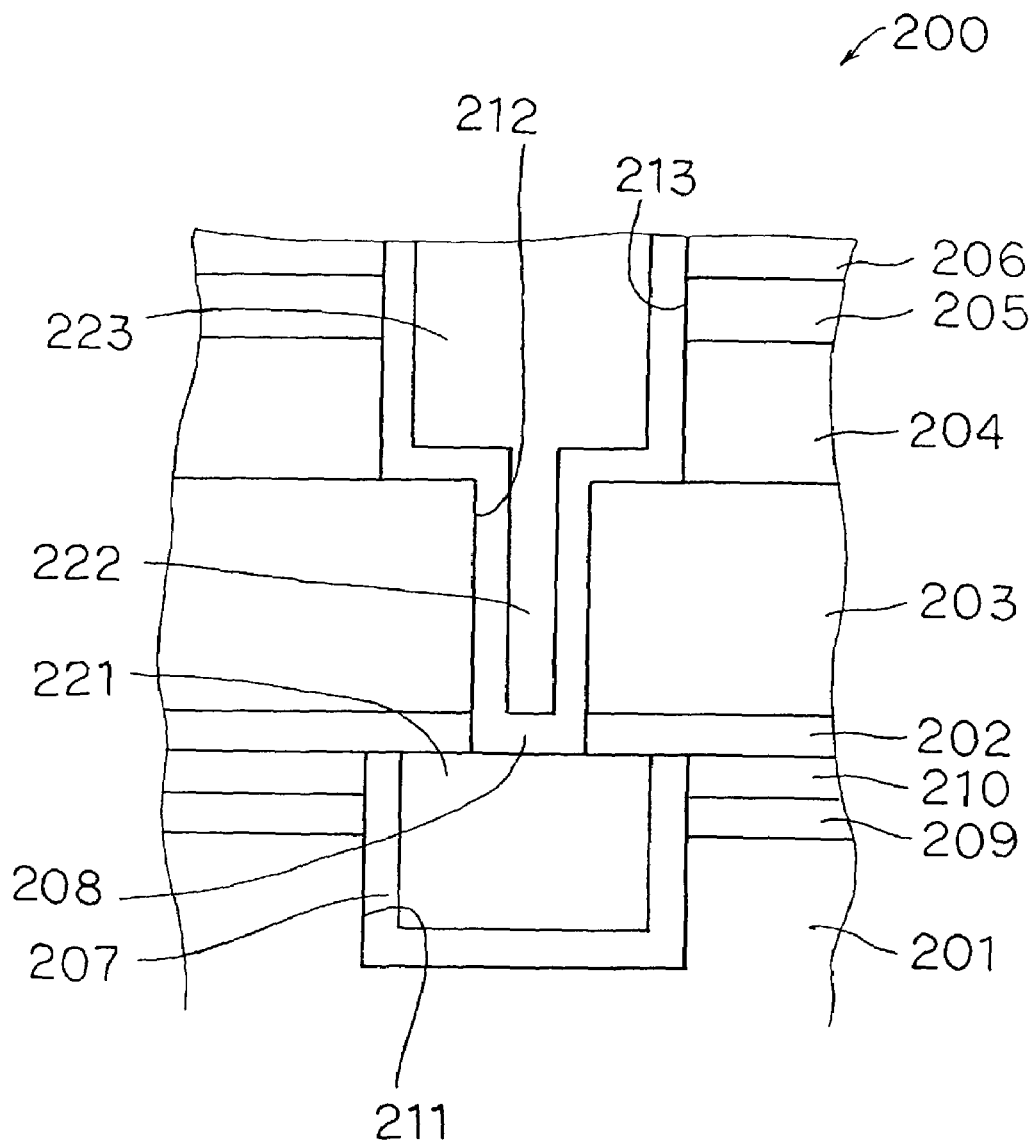
FIG. 2 is a vertical cross-sectional view showing an internal structure of a dual damascene circuit as an integrated circuit device according to an embodiment of the present invention.

As shown in FIG. 2, dual damascene circuit 200 as an integrated circuit device according to an embodiment of the present invention has lower interlayer film 201 on which there are successively deposited barrier insulating film 202, organic polymer layer 203, low-permittivity layer 204, first mask layer 205, and second mask layer 206.

Lower groove 211 having a width of 0.4 $\mu$m is formed in lower interlayer film 201 from its upper surface to a certain depth. Lower wiring 221 is embedded in lower groove 211 with a metal barrier 207 interposed between lower wiring 221 and the wall of lower groove 211. Metal barrier 207 has a thickness of 300 Å and is made of TaN, and lower wiring 221 is made of Cu.

Barrier insulating film 202 has a thickness of 500 Å and is made of P—SiC. Barrier insulating film 202 is formed on the upper surface of lower interlayer film 201 and the upper surface of lower wiring 221. Organic polymer layer 203 is made of a CH-based organic polymer such as polyphenylene, polyarylene, polyarylene ether, benzocyclobutene, or the like, and has a thickness of 3000 Å. Via hole 212 having a diameter of 0.2 $\mu$m is formed in organic polymer 203 and barrier insulating film 202 from the upper surface to the lower surface thereof. Interconnect line 222 of Cu is embedded in via hole 212.

Low-permittivity layer 204 has a thickness of 2000 Å and is made of porous MSQ. First mask layer 205 has a thickness of 500 Å and is made of $SiO_2$. Second mask layer 206 has a thickness of 500 Å and is made of SiN. Upper groove 213 having a depth of 3000 Å and a width of 0.4 $\mu$m is formed in second mask layer 206, first mask layer 205, and low-permittivity layer 204. Upper wiring 223 of Cu is embedded in upper groove 213 with metal barrier 208 interposed between upper wiring 223 and the wall of upper groove 213. Metal barrier 203 has a thickness of 300 Å and is made of TaN.

With dual damascene circuit 200 according to the present embodiment, lower wiring 221 is formed in the same manner as upper wiring 223. Therefore, mask layers 209, 210 similar to first and second mask layers 205, 206 are positioned on lower interlayer film 201.

Figure 3C:
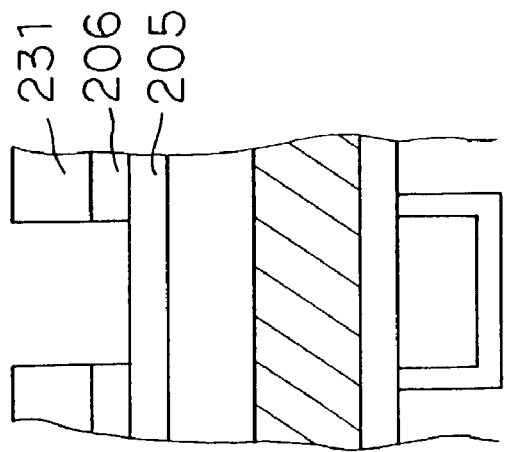
FIGS. 3a through 3c are vertical cross-sectional views showing successive steps of a method of manufacturing the integrated circuit device shown in FIG. 2.

A method of manufacturing dual damascene circuit 200 according to the present invention will be described below. First, lower groove 211 is formed in lower interlayer film 201 from its upper surface to a certain depth, and lower wiring 221 is embedded in lower groove 211, in the same manner as upper wiring 223 as described later on. Then, as shown in FIG. 3a, barrier insulating film 202, organic polymer layer 203, low-permittivity layer 204, first mask layer 205, and second mask layer 206 are successively layered over the upper surface of lower interlayer film 201 with lower wiring 221 embedded therein.

Barrier insulating film 202 is grown by plasma CVD (Chemical Vapor Deposition), and organic polymer layer 203 and low-permittivity layer 204 are formed by applying and baking given materials. Low-permittivity layer 204 is formed of porous MSQ by introducing a large quantity of fine air bubbles into MSQ that is applied to the upper surface of organic polymer layer 203.

Figure 3B:
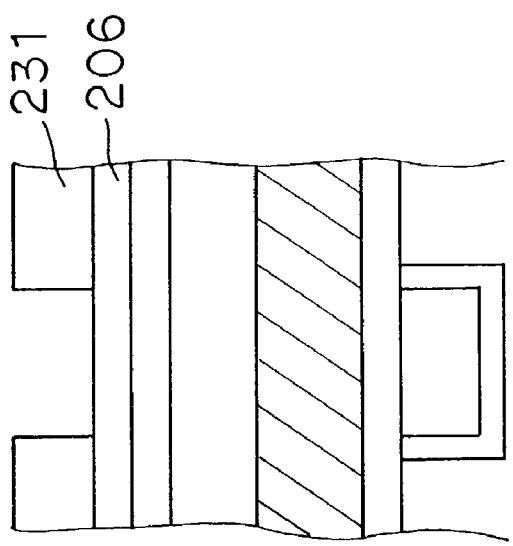
Figure 3A:
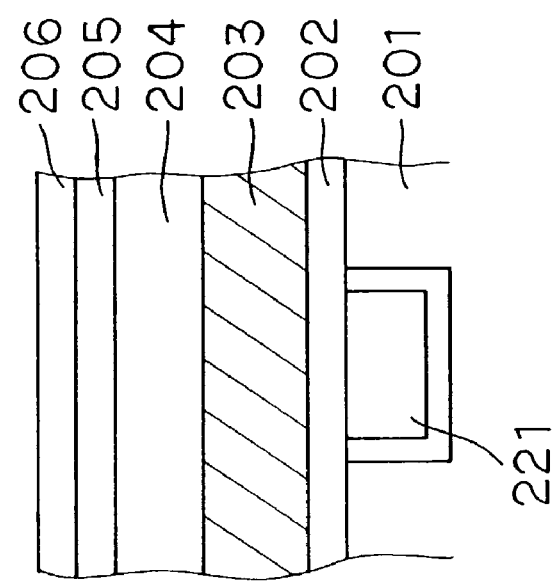

Then, as shown in FIG. 3b, resist mask 231 having an opening shaped like upper groove 213 is formed on the upper surface of second mask layer 206. As shown in FIG. 3c, an opening having a shape corresponding to upper groove 213 is formed in second mask layer 206 through resist mask 231 by plasma etching.

Figures 4A, 4B, 4C:
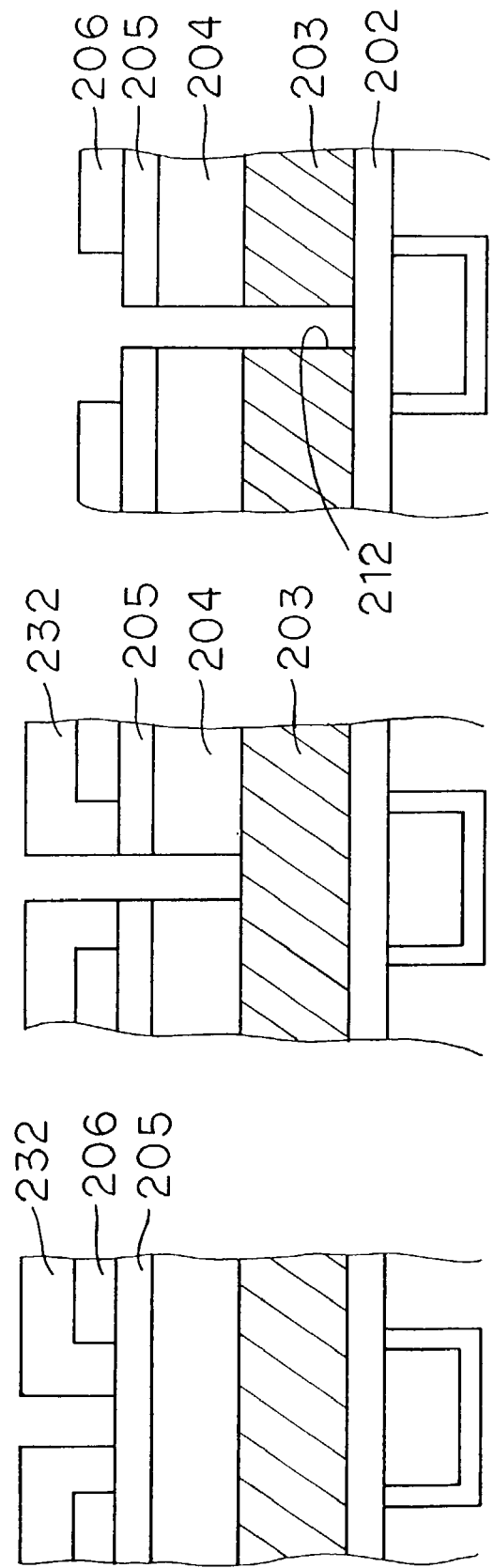
FIGS. 4a through 4c are vertical cross-sectional views showing successive steps of the method of manufacturing the integrated circuit device shown in FIG. 2.

After the processing of second mask layer 206, resist mask 231 is removed by $O_2$ ashing. As shown in FIG. 4a, resist mask 232 having an opening shaped like via hole 212 is formed on the upper surface of second mask layer 206 and the upper surface of an exposed portion of first mask layer 205.

As shown in FIG. 4b, an opening having a shape corresponding to via hole 212 is formed successively in first mask layer 205 and low-permittivity layer 204 down to the upper surface of organic polymer layer 203 through resist mask 232 by plasma etching. Thereafter, as shown in FIG. 4c, resist mask 232 is removed by plasma etching, and via hole 212 is formed in organic polymer layer 203 down to the upper surface of barrier insulating film 202 through first mask layer 205 used as an etching mask.

In the plasma etching for forming via hole 212 in organic polymer layer 203, a reactive gas of $N_2+H_2$ is used, a stage temperature is set to a range from 0 to 30° C., a gas pressure is set to a range from 300 to 1000 mToll, and an electric power is set to a range from 1000 to 2000 W.

Then, as shown in FIG. 5a, upper groove 213 is formed successively in first mask layer 206 and low-permittivity layer 204 down to the upper surface of organic polymer layer 203 through second mask layer 206 as an etching mask by plasma etching. After upper groove 213 is formed, deposits applied to various areas upon formation of upper groove 213 are removed by an organic removal liquid.

In the plasma etching for forming upper groove 213 in first mask layer 206 and low-permittivity layer 204, a reactive gas of $C_4F_8+N_2+Ar+O_2$ or $C_4F_8+N_2+Ar+CO$ is used, a stage temperature is set to a range from 0 to 30° C., a gas pressure is set to a range from 10 to 100 mToll, and an electric power is set to a range from 100 to 600 W.

Then, as shown in FIG. 5b, via hole 212 is extended down to the upper surface of lower wiring 221 through organic polymer layer 203 used as an etching mask by plasma etching through barrier insulating film 202. After via hole 212 is thus formed, deposits applied to various areas are removed by an organic removal liquid.

In the plasma etching for extending via hole 212 through barrier insulating film 202, a reactive gas of $C_4F_8+N_2+Ar$ is used, a stage temperature is set to a range from 0 to 30° C., a gas pressure is set to a range from 10 to 100 mToll, and an electric power is set to a range from 100 to 600 W.

Upper groove 213 and via hole 212 are now continuously opened from the upper surface of second mask layer 206 to the upper surface of lower wiring 221. As shown in FIG. 5c, metal barrier 208 is grown to a thickness of 300 Å on the surface formed so far in a vacuum by sputtering.

Cu film 233 is then grown to a thickness of 1000 Å on the surface of metal barrier 208 in a vacuum by sputtering, and Cu layer 234 is grown to a thickness of 6000 Å on the surface of Cu film 233 by plating. Then, the metal barrier 208, Cu film 233, and Cu layer 234 are polished by CMP to a level flush with the upper surface of second mask layer 206, thus completing dual damascene circuit 200 shown in FIG. 2.

With dual damascene circuit 200 according to the present embodiment, the permittivity of CH-based organic polymer layer 203 is in the range from 2.5 to 2.6, and the permittivity of low-permittivity layer 204 of porous MSQ is in the range from 2.0 to 2.2. Therefore, the effective permittivity of the entire circuit is well reduced.

In particular, since low-permittivity layer 204 is of a porous structure, the effective permittivity of the entire circuit is highly reduced. As low-permittivity layer 204 and organic polymer layer 203 have high etching selectivity with respect to each other, it is possible to form upper groove 213 and via hole 212 to a desired shape to allow upper wiring 223 and interconnect line 222 to have good electric characteristics.

Because barrier insulating film 202 of P—SiC has good etching selectivity with respect to organic polymer layer 203 and low-permittivity layer 204, it is possible to etch only barrier insulating film 202 under such conditions as to prevent lower wiring 221 from being corroded. Therefore, when via hole 212 and upper groove 213 are formed, lower wiring 221 is not corroded, providing good electric characteristics such as electric connection between lower wiring 221 and interconnect line 222.

In the manufacturing method according to the present invention, with first mask layer 205 formed on the upper surface of low-permittivity layer 204, via hole 212 is formed in organic polymer layer 203, and upper groove 213 is formed in first mask layer 205 and low-permittivity layer 204 through first mask layer 206 by plasma etching. Therefore, there is no need for a resist mask which would otherwise be formed on and removed from the upper surface of low-permittivity layer 204, which is thus prevented from being deteriorated by the formation and removal of such a resist mask.

The present invention is not limited to the above embodiment, but may be modified in various ways without departing from its scope. For example, in the above embodiment, dual damascene circuit 200 having organic polymer layer 203 and low-permittivity layer 204 successively layered over the upper surface of barrier insulating film 202 is illustrated. However, a dual damascene circuit may be produced by successively depositing low-permittivity layer 204 and organic polymer layer 203 on the upper surface of barrier insulating film 202.

In the above dual damascene circuit, in order to planarize the upper surface without changing the thickness of organic polymer layer 203 for forming upper wiring 223, the upper surface of low-permittivity layer 204 is planarized by CMP. Since, however, CMP can easily be performed on low-permittivity layer 204, but is difficult to carry out on organic polymer layer 203, the upper surface of the circuit can be planarized more easily with the above dual damascene circuit which is produced by successively depositing low-permittivity layer 204 and organic polymer layer 203 on the upper surface of barrier insulating film 202.

More specifically, since lower wiring 221 is produced according to the same process as wit upper wiring 223, lower wiring 221 embedded in lower groove 221 is produced by forming a metal film (not sown) on the upper surface of lower interlayer film 201 with lower groove 211 formed therein, and polishing the metal film until the upper surface of lower interlayer film 201 is exposed.

When the inventor of the present invention actually produced lower wiring 221 in the manner described above, it was found that the upper surface of lower wiring 221 is concave downwardly with respect to the upper surface of lower interlayer film 201. If organic polymer layer 203 and low-permittivity layer 204 are formed in the above structure, then the upper surfaces of these layers are also concave downwardly above lower wiring 221. The inventor then found that when metal barrier 208, Cu film 233, and Cu layer 234 are polished by CMP to a level flush with the upper surface of second mask layer 206, an unwanted metal layer remains unremoved on the surface of second mask layer 206, causing failures.

To prevent the above deficiency, it is preferable to successively deposit low-permittivity layer 204 and organic polymer layer 203 on the upper surface of barrier insulating film 202, planarize the upper surfaced of low-permittivity layer 204 according to CMP, and then deposit organic polymer layer 203. In this case, low-permittivity layer 204 may be made of MSQ, HSQ, MHSQ, or a carbon-containing silicon oxide film. However, a carbon-containing silicon oxide film which has a high Young's modulus of 6 (GPa) and a high Vickers hardness of 1.0 (GPa) is most preferable among these materials.

In addition, an above-mentioned carbon-containing silicon oxide film can be formed by the plasma CVD methods, such as gas which makes organosilane gas and oxygen content gas a part, and contains them at least, and gas which makes ORGANO siloxane gas a part and contains it at least. And above-mentioned machine hardness is realizable by optimizing the conditions of the thin film.

In the above embodiment, low-permittivity layer 204 is made of porous MSQ. However, low-permittivity layer 204 may be made of porous HSQ, porous MHSQ, MSQ, HSQ, MHSQ, or the like. Organic polymer layer 203 may also be of a porous structure.

In the above embodiment, barrier insulating film 202 is made of P—SiC. However, barrier insulating film 202 may be made of PSiCN, PSiCO, or the like.

While preferred embodiments of the present invention have been described using specific terms, such description is for illustrative purposes only, and it is to be understood that changes and variations may be made without departing from the spirit or scope of the following claims.

What is claimed is:

1. An integrated circuit device comprising:
   a lower interlayer film;
   a lower groove formed in said lower interlayer film to a prescribed depth;
   a lower wiring embedded in said lower groove, said lower wiring having an upper surface;
   a barrier insulating film layered over said lower interlayer film;
   a first layer disposed over the upper surface of said barrier insulating film, said first layer having an upper surface;
   a second layer disposed directly over and in contact with the upper surface of said first layer, said second layer having an upper surface;
   an upper groove formed in said second layer, said upper groove extending from the upper surface of the second layer to a bottom portion disposed over a portion of the upper surface of said first layer;
   upper wiring embedded in said upper groove;
   a via hole formed through said first layer and said barrier insulating film, said via hole extending from the bottom portion of said upper groove adjacent to the upper surface of the first layer to the upper surface of said lower wiring; and
   an interconnect line embedded in said via hole;
   wherein one of said first layer and said second layer is a CH-based organic polymer layer and the other of said first layer and said second layer is a low-permittivity layer made of one of MSQ, HSQ, MHSQ, and a carbon-containing silicon oxide film, and
   wherein said upper groove is wider than said via hole.

2. An integrated circuit according to claim 1, wherein said first layer is a low-permittivity layer made of one of MSQ, HSQ, MHSQ and a carbon-containing silicon oxide film, and said second layer is a CH-based organic polymer film.

3. An integrated circuit according to claim 2, wherein said organic polymer layer is made of one of polyphenylene, polyarylene, polyarylene ether, and benzocyclobutene.

4. An integrated circuit according to claim 2, wherein at least one of said low-permittivity layer and said organic polymer layer is of a porous structure.

5. An integrated circuit according to claim 2, wherein said lower wiring, said upper wiring, and said interconnect line are made of Cu.

6. An integrated circuit device according to claim 2, wherein said first layer comprises said carbon-containing silicon oxide film, and has said upper surface of the low-permittivity layer planarized by chemical mechanical polishing.

7. A method of manufacturing an integrated circuit device according to claim 2, comprising the steps of:
   embedding lower wiring in the lower groove formed in said lower interlayer film to the prescribed depth;
   depositing the barrier insulating film over said lower interlayer film;
   depositing the low-permittivity layer made of one of MSQ, HSQ, MHSQ, and a carbon-containing silicon oxide film on the upper surface of said baffler insulating film;
   depositing the CH-based organic polymer layer on the upper surface of said low-permittivity layer;
   forming an opening in said organic polymer layer, said opening extending down from at least the upper surface of said low permittivity layer to the upper surface of said low-permittivity layer;

forming the via hole in said low-permittivity polymer layer from the bottom of said opening to the upper surface of said barrier insulating film;

forming the upper groove in said organic polymer layer from at least the upper surface of said organic polymer layer to the upper surface of said low-permittivity layer in alignment with said via hole;

extending said via hole which is open at the bottom of said upper groove to the upper surface of lower wiring by removing an exposed portion of said barrier insulating film; and embedding bodies of metal integrally in said via hole and said upper groove thereby forming said interconnect line and said upper wiring.

8. A method of manufacturing an integrated circuit device according to claim 6, comprising the steps of:

embedding lower wiring in the lower groove formed in said lower interlayer film from the upper surface thereof to the prescribed depth;

depositing the barrier insulating film on the upper surface of said lower interlayer film with lower wiring embedded therein;

depositing the low-permittivity layer made of one of the carbon-containing silicon oxide film on the upper surface of said barrier insulating film;

planarizing the upper surface of said low-permittivity layer by chemical mechanical polishing;

depositing the CH-based organic polymer layer on the upper surface of said barrier insulating film;

forming an opening in said organic polymer layer from the upper surface thereof to the upper surface of said low-permittivity layer;

forming the via hole in said low-permittivity polymer layer from the bottom of said opening to the upper surface of said barrier insulating film;

forming the upper groove in said organic polymer layer from the upper surface thereof to the upper surface of said low-permittivity layer in alignment with said via hole;

extending said via hole which is open at the bottom of said upper groove to the upper surface of lower wiring by removing an exposed portion of said barrier insulating film; and embedding bodies of metal integrally in said via hole and said upper groove thereby forming said interconnect line and said upper wiring.

9. An integrated circuit according to claim 1, wherein said first layer is a CH-based organic polymer layer and said second layer is a low-permittivity layer made of one of MSQ, HSQ, MHSQ and a carbon-containing silicon oxide film.

10. An integrated circuit according to claim 9, wherein said organic polymer layer is made of one of polyphenylene, polyarylene, polyarylene ether, and benzocyclobutene.

11. An integrated circuit according to claim 9, wherein at least one of said low-permittivity layer and said organic polymer layer is of a porous structure.

12. An integrated circuit according to claim 9, wherein said lower wiring, said upper wiring, and said interconnect line are made of Cu.

13. A method of manufacturing an integrated circuit device according to claim 9, comprising the steps of:

forming the lower interlayer film;

forming the lower groove in said lower interlayer film to the prescribed depth;

embedding lower wiring in the lower groove formed in said lower interlayer film to the prescribed depth;

depositing the barrier insulating film over said lower interlayer film;

depositing the CH-based organic polymer layer on the upper surface of said baffler insulating film;

depositing the low-permittivity layer made of one of MSQ, HSQ, MHSQ, and a carbon-containing silicon oxide film on the upper surface of said organic polymer layer;

forming an opening in said low-permittivity layer, said opening extending down from at least the upper surface of said low-permittivity layer to the upper surface of said organic polymer layer, the opening in said lower-permittivity layer corresponding to the upper groove;

embedding the upper wiring in said upper groove;

forming the via hole in said organic polymer layer from the bottom of said opening to the upper surface of said baffler insulating film;

forming the upper groove in said low-permittivity layer from at least the upper surface of said low-permittivity layer to the upper surface of said organic polymer layer in alignment with said via hole;

extending said via hole which is open at the bottom of said upper groove to the upper surface of lower wiring by removing an exposed portion of said barrier insulating film;

embedding the interconnect line in said via hole; and embedding bodies of metal integrally in said via hole and said upper groove thereby forming said interconnect line and said upper wiring.

* * * * *